(12) United States Patent
Jang et al.

(10) Patent No.: US 8,609,245 B2
(45) Date of Patent: Dec. 17, 2013

(54) SEMICONDUCTOR NANOCRYSTALS AND PREPARATION METHODS THEREOF

(75) Inventors: Eun Joo Jang, Suwon-si (KR); Shin Ae Jun, Seongnam-si (KR); Hyo Sook Jang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 718 days.

(21) Appl. No.: 12/464,537

(22) Filed: May 12, 2009

(65) Prior Publication Data

US 2010/0159248 A1 Jun. 24, 2010

(30) Foreign Application Priority Data

Dec. 19, 2008 (KR) .................. 10-2008-0130506

(51) Int. Cl.
*H01B 1/02* (2006.01)
*B32B 1/00* (2006.01)

(52) U.S. Cl.
USPC ............ 428/402; 428/403; 438/479; 977/774

(58) Field of Classification Search
None
See application file for complete search history.

(56) References Cited

U.S. PATENT DOCUMENTS

| 6,794,265 B2 * | 9/2004 | Lee et al. ...................... 438/409 |
| 7,105,051 B2 | 9/2006 | Peng et al. |
| 2006/0157720 A1 | 7/2006 | Bawendi et al. |

FOREIGN PATENT DOCUMENTS

| KR | 10-2008-0019678 A | 3/2008 |
| KR | 10-2008-0070101 A | 7/2008 |
| WO | WO 2005022120 A2 * | 3/2005 |
| WO | 2006134599 A1 | 12/2006 |
| WO | WO 2008028054 A1 * | 3/2008 |

OTHER PUBLICATIONS

Stowell et al. (Synthesis and Characterization of Dilute Magnetic Semiconductor Manganese-Doped Indium Arsenide Nanocrystals, Nano Letters vol. 3, No. 10, 1441-1447 (2003)).*
Yang et al. (Radial-Position-Controlled Doping of CdS/ZnS Core/Shell Nanocrystals, J. Am. Chem. Soc. 2006, 128.*
Mikulec et al. (Organometallic Syntehsis and Spectroscopic Characerization of Manganese-Doped CdSe Nanocrystals, J. Am. Chem. Soc. 2000, 122, 2532-2540).*
Erwin et al. (Doping semiconductor nanocrystals, Nature, vol. 436, p. 91-94 (2005).*
Talapin et al., Etching of Colloidal InP Nanocrystals with Fluorides: Photochemical Nature of the Process Resulting in High Photoluminescence Efficiency, J. Phys. Chem. B 2002, 106, 12659-12663.

* cited by examiner

Primary Examiner — Mark Ruthkosky
Assistant Examiner — Alexandre Ferre
(74) Attorney, Agent, or Firm — Cantor Colburn LLP

(57) ABSTRACT

A nanocrystal includes a core including a Group III-V semiconductor and a transition metal alloyed with the Group III-V semiconductor, wherein the transition metal is present at a higher molar concentration in an outermost surface layer of the core than in a central portion of the core.

29 Claims, 10 Drawing Sheets

US 8,609,245 B2

SEMICONDUCTOR NANOCRYSTALS AND PREPARATION METHODS THEREOF

CROSS-REFERENCE TO RELATED APPLICATION

This application claims priority to Korean Patent Application No. 10-2008-130506, filed on Dec. 19, 2008, and all the benefits accruing therefrom under 35 U.S.C. § 119, the contents of which in its entirety are herein incorporated by reference.

BACKGROUND

1. Field

The present disclosure is directed to semiconductor nanocrystals and methods for preparing the same. More specifically, the methods are related to the preparation of Group III-V semiconductor nanocrystals having controlled emission wavelength and improved color purity.

2. Description of the Related Art

A semiconductor nanocrystal, also called a "quantum dot," is a crystalline semiconductor material having a size of a few nanometers and consisting of several hundred to several thousand atoms. A semiconductor nanocrystal has a large surface area per unit volume and exhibits various effects (e.g., quantum confinement) due to its small size. These structural characteristics and effects account for unique physicochemical properties of the semiconductor nanocrystal material and can be different from properties inherent to the constituent semiconductor material. The photoelectronic properties of a nanocrystal can be controlled by varying the size of the nanocrystal. Research efforts are directed toward the development of a nanocrystal applicable to a variety of display devices, including bioluminescent display devices. A semiconductor nanocrystal free of heavy metals can possess many advantages as a luminescent material because of its environmental friendliness and safety in humans. Many techniques for controlling the size, structure and uniformity of semiconductor nanocrystals are currently being developed in order to better utilize their desirable characteristics and broad applicability.

Group III-V semiconductor nanocrystals have recently attracted much attention in view of Group II-VI semiconductor nanocrystals, which can cause environmental pollution problems. However, a Group III-V semiconductor nanocrystal, as well as its precursors, can be sensitive to oxygen and moisture during preparation. Further, a Group III-V semiconductor nanocrystal can be difficult to synthesize. In addition, the growth rate of a Group III-V semiconductor nanocrystal can be difficult to control, limiting control of the emission wavelength region of the nanocrystal. Moreover, a Group III-V semiconductor nanocrystal having a broad size distribution can have low color purity, limiting its applicability to luminescent devices.

It is therefore desirable to have a Group III-V semiconductor nanocrystal that provides controlled emission wavelength and improved color purity.

SUMMARY

Disclosed herein is a nanocrystal, including a core including a Group III-V semiconductor and a transition metal alloyed with the Group III-V semiconductor, wherein the transition metal is present at a higher molar concentration in an outermost surface layer of the core than in a central portion of the core.

Also disclosed herein is a method for preparing a nanocrystal, the method includes: mixing an organic solvent, a surfactant, a Group III element precursor and a transition metal precursor to form a mixture; heating the mixture; and adding a Group V element precursor to the mixture while maintaining a substantially constant reaction temperature.

Also disclosed is a nanocrystal, including: a core including In, Zn and P, wherein equal to or greater than about 80 mole percent of the Zn is contained in an outermost surface layer of the core, the outermost surface layer having a thickness of equal to or less than about 1 nanometer; and a shell, the shell including ZnS.

Also disclosed herein is a method for preparing a nanocrystal, the method includes: mixing an organic solvent, a surfactant, a Group III element precursor and a transition metal precursor to prepare a first mixture; injecting a Group V element precursor into the first mixture at about room temperature to prepare a second mixture; and heating the second mixture and maintaining the reaction temperature constant.

Also disclosed herein is a method for preparing a nanocrystal, the method includes: mixing a first organic solvent, a surfactant, a Group III element precursor and a transition metal precursor to prepare a first mixture; injecting a Group V element precursor into the first mixture at about room temperature to prepare a second mixture; and heating a second organic solvent and injecting the second mixture into the second organic solvent while maintaining the reaction temperature constant.

Also disclosed herein is a color filter including a nanocrystal. Also disclosed herein is a light emitting device including a nanocrystal as a luminescent material.

BRIEF DESCRIPTION OF THE DRAWINGS

The exemplary embodiments will be more clearly understood from the following detailed description taken in conjunction with the accompanying drawings, in which.

DETAILED DESCRIPTION

Figure 1:
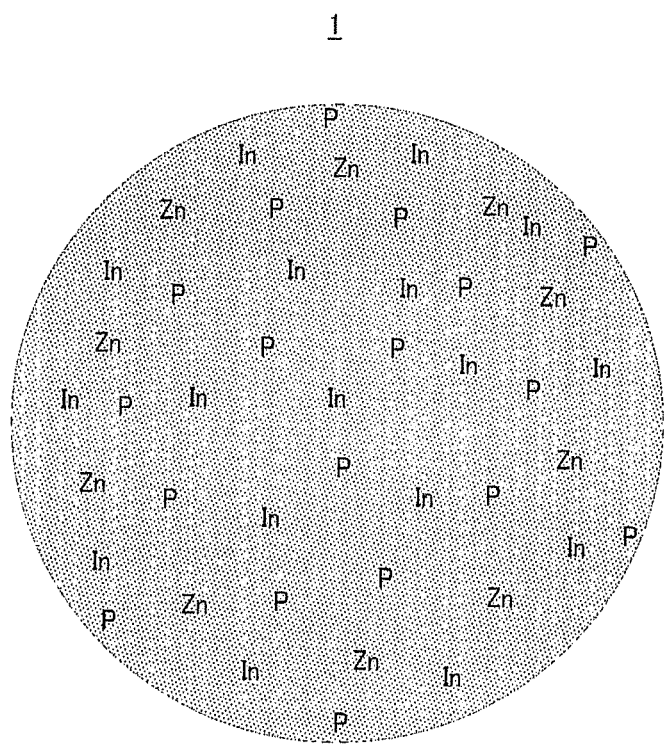
FIG. 1 illustrates an exemplary embodiment of a core.

Exemplary embodiments are described in greater detail hereinafter with reference to the accompanying drawings, in which embodiments of the invention are shown. These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower" can therefore encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

According to one exemplary embodiment, a nanocrystal is provided which includes a core comprising a Group III-V semiconductor and a transition metal alloyed with the Group III-V semiconductor wherein the transition metal is present at a higher molar concentration in an outermost surface layer of the core than in a central portion of the core. In an embodiment, the core consists essentially of a Group III-V semiconductor and a transition metal alloyed with the Group III-V semiconductor. In another embodiment, the core consists of a Group III-V semiconductor and a transition metal alloyed with the Group III-V semiconductor. The core can be formed using a method that is based on the fact that a reaction rate between Group III and Group V elements is higher than a reaction rate between the transition metal and the Group V element. This method is further disclosed hereinafter in an exemplary embodiment of a method for the preparation of the nanocrystal. In an embodiment, between about 20 mole percent ("mol %") and about 99 mol %, specifically between about 50 mol % and about 90 mol %, more specifically between about 70 mol % and about 85 mol % of the transition metal is present in an outermost surface layer of the core, the outermost surface layer having a thickness between about 0.1 nanometers ("nm") and about 10 nm, specifically between about 0.1 nm and about 5 nm, more specifically about 1 nm. In one exemplary embodiment, at least about 80 mol % of the transition metal may be distributed within an outermost surface layer of the core, the outermost surface layer having a thickness of about 1 nm measured inwardly from an outermost surface of the core toward the central portion of the core. In one exemplary embodiment, at least about 80 mol % of the transition metal may be distributed within about 1 nm of an outermost surface of the core. Thus in an embodiment, the nanocrystal has a gradient alloy structure in which the core has a composition gradient of the transition metal. The transition metal present at or near the surface of the nanocrystal can protect the Group III element from oxidation and can reduce the number of defects in the nanocrystal. In addition, the transition metal can serve to improve bonding between the core and a shell disposed on the core and can maintain the direct transition emission properties of the nanocrystal. In contrast, if the transition metal is present in the form of a dopant in the core, direct transition emission in the nanocrystal may not occur and the emission wavelength of the nanocrystal can be dependent on the kind and concentration of the dopant, thus governed by intrinsic properties, rather than the size of the nanocrystal.

FIG. 1 illustrates the structure of an exemplary embodiment of a core 1 of a nanocrystal. The core 1 is prepared by alloying indium (In) as a Group III element and phosphorus (P) as a Group V element with zinc (Zn) as a transition metal in accordance with an exemplary embodiment of a method, which is further disclosed below. As illustrated in FIG. 1, the indium is bound to the phosphorus in the central portion of the core 1, and the zinc is bound to phosphorus in the outermost surface layer of the core 1. Although FIG. 1 shows the absence of the zinc in the central portion of the core 1, it is to be understood that some of the zinc atoms may be present in the central portion of the core 1.

Al, Ga, In, Ti or a combination thereof may be used as the Group III element, and P, As, Sb, Bi or a combination thereof may be used as the Group V element. In one exemplary embodiment, the transition metal may be Zn, Mn, Cu, Fe, Ni, Co, Cr, V, Ti, Zr, Nb, Mo, Ru, Rh, or the like or a combination thereof. In an embodiment, the transition metal may have two or more formal oxidation states. In one exemplary embodiment, the Group III element and the transition metal in the core may be present in a molar ratio between about 10:1 and about 100:1, specifically between about 20:1 and about 80:1, more specifically about 50:1. When the concentration of the transition metal is between about one tenth and one hundredth of the concentration of the Group III element in the core, it can be easier to control the emission wavelength of the nanocrystal and the removal of surface defects from the semiconductor nanocrystal can be facilitated, improving the luminescence efficiency of the nanocrystal. An increase in the concentration of the transition metal can decrease the full width at half maximum ("FWHM") of the emission peak, leading to an improvement in color purity.

In one exemplary embodiment, the Group III element and the Group V element in the core may be present in a molar ratio between about 0.1:1 and about 3:1, specifically between about 1:1 and about 2.5:1, more specifically about 2:1. When the concentration of the Group III element is less than or equal to about three times that of the Group V element in the core, the crystal structure of the semiconductor nanocrystal may be more easily formed. At greater concentrations of the Group III element, which is more metallic than the Group V element, the Group III element can be present in a large amount at the surface of the nanocrystal, where it may be bound to an organic ligand.

In another embodiment, the Group III element and the Group V element in the core may be present in a molar ratio between about 0.1:1 and about 10:1, specifically between about 0.5:1 and about 3:1, more specifically about 2:1.

In accordance with another exemplary embodiment, the nanocrystal can further includes a shell formed on the surface of the core wherein the shell comprises a semiconductor selected from the group consisting of a Group II-VI semiconductor, a Group III-V semiconductor, a Group IV-VI semiconductor, and the like and a combination comprising at least one of the foregoing semiconductors. In an embodiment, the shell consists essentially of a semiconductor selected from the group consisting of a Group II-VI semiconductor, a Group III-V semiconductor, a Group IV-VI semiconductor, and the like and a combination thereof. In another embodiment, the shell consists of a semiconductor selected from the group consisting of a Group II-VI semiconductor, a Group III-V semiconductor, a Group IV-VI semiconductor, and the like and a combination thereof. The shell substantially surrounds the core and can prevent surface defects in the nanocrystal, improving the stability of the nanocrystal. In an embodiment, the shell completely surrounds the core. Further, in an embodiment wherein the shell comprises a metal having a formal oxidation state substantially equal to that of the transition metal distributed on the surface of the core, the reactivity of the nanocrystal can be improved. If there is a small difference in size between the constituent elements of the core and shell, the lattice size of the core may match that of the shell, which can facilitate formation of the shell.

Figure 2:
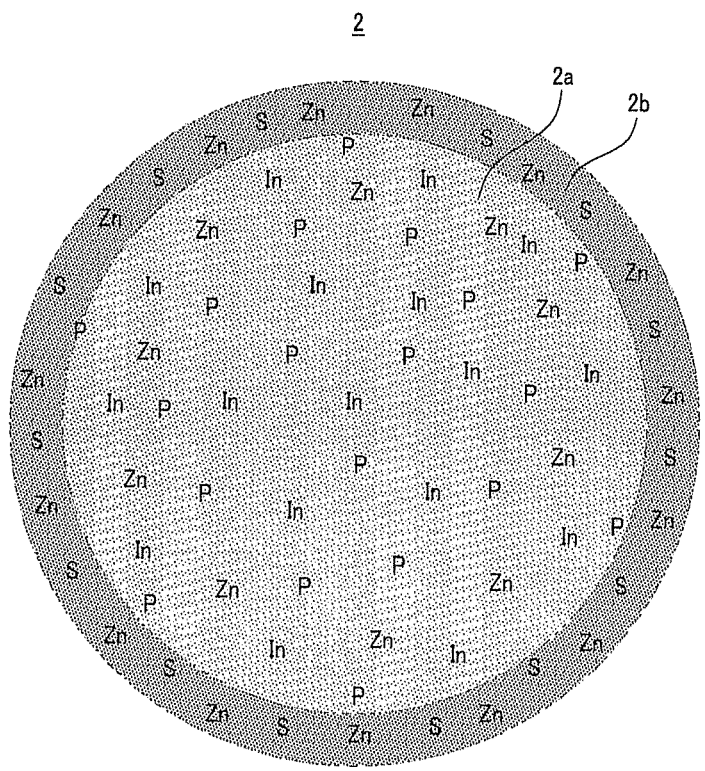
FIG. 2 is a schematic diagram illustrating an exemplary embodiment of a nanocrystal.

FIG. 2 illustrates the structure of a nanocrystal 2 comprising a core 2a and a shell 2b. In an embodiment, the nanocrystal 2 consists essentially of a core 2a and a shell 2b. In another embodiment, the nanocrystal 2 consists of a core 2a and a shell 2b. The shell 2b surrounds the core 2a and the core 2a can comprise InZnP and the shell 2b can comprise Zn and S. In an embodiment, the core can consist essentially of InZnP and the shell can consist essentially of Zn and S. In another embodiment, the core can consist of InZnP and the shell can consist of Zn and S. The core can comprise a transition metal belonging to the Group II elements and a Group VI element. In an embodiment, the core can consist essentially of a Group II element and a Group VI element. In another embodiment, the core can consist of a Group II element and a Group VI element. The presence of the same metal, such as Zn at the interface between the core 2a and the shell 2b decreases the possibility that the Group III element, such as indium, present in the core may be oxidized to form an oxide, such as indium oxide (e.g., $In_2O_3$), and the relatively oxidation-resistant Group II element, such as zinc, may be oxidized to form ZnO. The zinc contained in the core can also participate in a reaction with sulfur to facilitate the disposing of ZnS on the core, which can further improve the bonding between the core and the shell.

Zn, Cd, Hg or a combination thereof may be used as the Group II element, Si, Ge, Sn, Pb or a combination thereof may be used as the Group IV element, and O, S, Se, Te or a combination thereof may be used as the Group VI element. In one exemplary embodiment, the transition metal may be selected from the group consisting of Zn, Mn, Cu, Fe, Ni, Co, Cr, V, Ti, Zr, Nb, Mo, Ru, Rh, and the like and a combination thereof. In an embodiment, the emission wavelength of a nanocrystal containing a transition metal alloyed in a high molar concentration in the outermost surface layer of the core can be more easily controlled than that of a nanocrystal not containing a transition metal. In an embodiment, the emission wavelength of the nanocrystal can be controlled to be a visible wavelength, and can be between about 450 nm and about 750 nm.

The presence of the transition metal alloyed in a high molar concentration in the outermost surface layer of the core can decrease the FWHM of the emission peak of the nanocrystal and can increase the color purity of light from the nanocrystal.

In accordance with another exemplary embodiment, there is provided a method for preparing a nanocrystal, which includes: mixing an organic solvent, a surfactant, a Group III element precursor and a transition metal precursor to form a mixture; heating the mixture; and adding a Group V element precursor to the mixture while maintaining a substantially constant reaction temperature. The mixing of the organic solvent, the surfactant and the Group III element precursor may be carried out by any commercially available method. In an embodiment, the Group III element precursor, which can be a cationic precursor, a may be added to the organic solvent and the surfactant, or the organic solvent, the surfactant and the cationic precursor may be mixed together at substantially the same time.

Exemplary organic solvents include $C_6$-$C_{24}$ primary alkylamines, $C_6$-$C_{24}$ secondary alkylamines, $C_6$-$C_{24}$ tertiary alkylamines, $C_6$-$C_{24}$ primary alcohols, $C_6$-$C_{24}$ secondary alcohols, $C_6$-$C_{24}$ tertiary alcohols, $C_6$-$C_{24}$ ketones, $C_6$-$C_{24}$ esters, $C_6$-$C_{24}$ heterocyclic compounds containing at least one heteroatom selected from nitrogen and sulfur atoms, $C_6$-$C_{24}$ alkanes, $C_6$-$C_{24}$ alkenes, $C_6$-$C_{24}$ alkynes, $C_6$-$C_{24}$ trialkyl phosphines such as trioctyl phosphine, $C_6$-$C_{24}$ trialkyl phosphine oxides such as trioctyl phosphine oxide, or the like or a combination comprising at least one of the foregoing organic solvents.

Exemplary surfactants include $C_6$-$C_{24}$ alkanes and $C_6$-$C_{24}$ alkenes having at least one terminal —COOH group, $C_6$-$C_{24}$ alkanes and $C_6$-$C_{24}$ alkenes having at least one terminal —POOH group, $C_6$-$C_{24}$ alkanes and $C_6$-$C_{24}$ alkenes having at least one terminal —SOOH group, $C_6$-$C_{24}$ alkanes and $C_6$-$C_{24}$ alkenes having at least one terminal —NH$_2$ group, or the like or a combination comprising at least one of the foregoing surfactants. The surfactant may be oleic acid, stearic acid, palmitic acid, hexyl phosphonic acid, n-octyl phosphonic acid, tetradecyl phosphonic acid, octadecyl phosphonic acid, n-octylamine, hexadecyl amine, or the like or a combination comprising at least one of the foregoing surfactants.

The Group III element precursor may be a carboxylate, carbonate, halide, nitrate, phosphate or sulfate of a Group III element, or the like or a combination comprising at least one of the foregoing. The Group III element can be Al, Ga, In or Ti. The transition metal precursor may be a carboxylate, carbonate, halide, nitrate, phosphate or sulfate of a transition metal, or the like or a combination comprising at least one of the foregoing. The transition metal can be Zn, Mn, Cu, Fe, Ni, Co, Cr, V, Ti, Zr, Nb, Mo, Ru, Rh, or the like or a combination comprising at least one of the foregoing. The Group V element precursor may be a carboxylate, carbonate, halide, nitrate, phosphate or sulfate of a Group V element, or the like or a combination comprising at least one of the foregoing. The Group V element can be P, As, Sb, Bi or a combination thereof.

The temperature of the mixture can be maintained at a temperature between about 10° C. and about 400° C., specifically between about 50° C. and about 300° C., more specifically about 100° C., and the pressure can be a pressure between about 0.1 kilopascals ("kPa") and about 200 kPa, specifically between about 5 kPa and about 100 kPa, more specifically about 10 kPa for time between about 1 minute and about 10 hours, specifically between about 10 minutes and about 5 hours, more specifically about 1 hour. In an embodiment the mixture can be maintained under vacuum for at least about one hour. In an embodiment wherein the first mixture is heated to a temperature between about 250° C. and about 350° C. under an inert atmosphere and the reaction temperature is maintained at a substantially constant temperature, the Group V element precursor is added to the mixture and the mixture allowed to react for a selected time of at least one minute. In this reaction, the Group III element can react with the Group V element at a higher rate than the transition metal reacts with the Group V element. As a result, the Group III element can be bound to the Group V element to form a core comprising an alloy and the concentration of the alloyed transition metal can increase outwardly from the central portion of the core towards the surface portion of the core. The reaction temperature can be selected depending on the characteristics of the reactants. Thereafter, the mixture is cooled to a temperature between about 0° C. and about 50° C., specifically between about 5° C. and about 40° C., more specifically about room temperature to precipitate colloidal semiconductor nanocrystals containing the Group III element, the transition metal and the Group V element.

In one exemplary embodiment, the molar ratio of the Group III element precursor to the surfactant may be between about 1:1 and about 1:20 specifically between about 1:5 and about 1:15, more specifically about 1:10. The use of the surfactant at a concentration lower than that of the Group III element precursor may lower the reaction efficiency and may adversely affect the dissolution or activation of the precursor. The use of the surfactant at a concentration 20 times higher than that of the Group III element precursor may impede the growth of the crystals, making control of the emission wavelength of the semiconductor nanocrystals and the FWHM of the emission peak more difficult.

In one exemplary embodiment, the molar ratio of the Group III element to the transition metal in the core may be between about 10:1 and about 100:1. In one exemplary embodiment, the molar ratio of the Group III element to the Group V element in the core may be between about 1:1 and about 3:1. Details of the molar ratios have already been provided above, and thus further description thereof is omitted herein.

In one exemplary embodiment, the method may further include forming a shell comprising a semiconductor selected from the group consisting of a Group II-V semiconductor, a Group III-V semiconductor, a Group IV-VI semiconductor, and the like and a combination thereof on the core. In an embodiment, the core can be a colloidal semiconductor nanocrystal. In an embodiment, the method may further include forming a shell consisting essentially of a semiconductor selected from the group consisting of a Group II-V semiconductor, a Group III-V semiconductor, a Group IV-VI semiconductor, and the like and a combination thereof on the core. In another exemplary embodiment, the method may further include forming a shell consisting of a semiconductor selected from the group consisting of a Group II-V semiconductor, a Group III-V semiconductor, a Group IV-VI semiconductor, and the like and a combination thereof on the core.

Zn, Cd, Hg or a combination thereof may be used as the Group II element, Al, Ga, In, Ti or a combination thereof may be used as the Group III element, Si, Ge, Sn, Pb or a combination thereof may be used as the Group IV element, P, As, Sb, Bi or a combination thereof may be used as the Group V element, and O, S, Se, Te or a combination thereof may be used as the Group VI element.

The shell can be formed by mixing a cationic precursor containing the Group II, III or IV element, a surfactant and an organic solvent at a reaction temperature between about 100° C. and about 400° C., specifically between about 150° C. and about 300° C., more specifically about 200° C., at a pressure between about 1 kPa and about 200 kPa, specifically between about 5 kPa and about 100 kPa, more specifically about 10 kPa for time between about 1 minute and about 10 hours, specifically between about 10 minutes and about 5 hours, more specifically about 1 hour. In an embodiment, the shell can be formed by mixing a cationic precursor containing the Group II, III or IV element, a surfactant and an organic solvent at a reaction temperature equal to or greater than about 100° C. under vacuum for at least about one hour, adding the colloidal semiconductor nanocrystal and an anionic precursor containing the Group V or VI element into the mixture under an inert atmosphere, and reacting the resulting mixture for a time between about 1 minute and about 10 hours, specifically between about 10 minutes and about 5 hours, more specifically about 1 hour at a temperature between about 200° C. and about 400° C., specifically between about 230° C. and about 350° C., more specifically about 300° C. to form a core-shell semiconductor nanocrystal.

In accordance with another exemplary embodiment, there is provided a method for preparing a nanocrystal, which includes: mixing an organic solvent, a surfactant, a Group III element precursor and a transition metal precursor to prepare a first mixture; adding a Group V element precursor to the first mixture at about room temperature to prepare a second mixture; heating the second mixture; and maintaining a substantially constant reaction temperature.

The preparation of the first mixture and the materials used are further explained above, and thus further explanation thereof is omitted herein. The second mixture is an intermediate precursor containing the Group III element, the Group V element and the transition metal. The intermediate precursor is heated at a temperature between about 100° C. and about 400° C., specifically between about 250° C. and about 350° C., more specifically at about 300° C. and is allowed to react while maintaining a substantially constant reaction temperature. By the use of the intermediate precursor, the molar ratio between the Group III element and the Group V element can be more easily controlled, the emission wavelength of the semiconductor nanocrystals can be blue-shifted and the FWHM of the emission peak can be decreased, thus improving a color purity of the nanocrystal.

In one exemplary embodiment, the molar ratio of the Group III element to the transition metal in the core may be between about 10:1 and about 100:1. In one exemplary embodiment, the molar ratio of the Group III element to the Group V element in the cores may be between about 1:1 and about 3:1. Further details of the molar ratios are disclosed above, and thus further description thereof is omitted herein.

In one exemplary embodiment, the method may further include forming a shell comprising a semiconductor selected from the group consisting of a Group II-V semiconductor, a Group III-V semiconductor, a Group IV-VI semiconductor and a combination thereof on the core. In an embodiment, the core can be a colloidal semiconductor nanocrystal. Details of the forgoing method are disclosed above, and thus further description thereof is omitted herein.

In accordance with another exemplary embodiment, there is provided a method for preparing a nanocrystal, the method includes: mixing a first organic solvent, a surfactant, a Group III element precursor and a transition metal precursor to prepare a first mixture; adding a Group V element precursor to the first mixture at about room temperature to prepare a second mixture; heating a second organic solvent; and adding the second mixture to the second organic solvent while maintaining a substantially constant reaction temperature.

The preparation of the first and second mixtures and the materials used are further explained above, and thus further explanation thereof is omitted herein. In this embodiment, the second mixture, as an intermediate precursor, can be quickly added to the heated second organic solvent to prepare a colloidal semiconductor nanocrystal. The quick addition of the second mixture while maintaining the reaction temperature of the second organic solvent can improve the uniformity of the resulting semiconductor nanocrystal. As further described above, by the use of the intermediate precursor, the molar ratio between the Group III element and the Group V element can be more easily controlled, the emission wavelength of the semiconductor nanocrystals can be blue-shifted and the FWHM of the emission peak can be decreased, improving a color purity of the semiconductor nanocrystals.

In one exemplary embodiment, the molar ratio of the Group III element to the transition metal in the core may be between about 10:1 and about 100:1. In one exemplary embodiment, the molar ratio of the Group III element to the Group V element in the core may be between about 1:1 and about 3:1. Details of the molar ratios are further disclosed above, and thus further description thereof is omitted herein.

In one exemplary embodiment, the method may further include forming a shell comprising a semiconductor selected from the group consisting of a Group II-V semiconductor, a Group III-V semiconductor, a Group IV-VI semiconductor and a combination thereof on core, wherein the core can be a colloidal semiconductor nanocrystal. Details of the optional forming of a shell are further disclosed above, and thus further description thereof is omitted herein.

In accordance with another exemplary embodiment, there is provided a color filter including the semiconductor nanocrystal. Generally, a liquid crystal display ("LCD") includes color filters, each of which has a primary color of red, green or blue and is included in a pixel. The color filter may further include at least one material selected from pigments, photosensitive organic materials, inorganic materials or the like. The color filter can be in the form of a film and may be disposed on a display. Alternatively, the color filter may be produced by disposing a solution containing the semiconductor nanocrystal on a selected portion of a display. The disposing may be performed by a coating process, such as spin coating, spray coating, or the like or a combination comprising at least one of the foregoing. Methods for producing the color filter are known in the art, and thus further detailed description is omitted herein.

In accordance with another exemplary embodiment, there is provided a current-driven light emitting device including the semiconductor nanocrystal as a luminescent material. The light emitting device may be an organic light emitting diode ("OLED"). An organic light emitting diode can have a structure in which an organic emission layer is disposed between two electrodes and electrons, injected from one of the electrodes, and holes, injected from the other electrode, combine together in the organic emission layer to form excitons, which decay from the excited state to the ground state and emit light.

Figure 3:
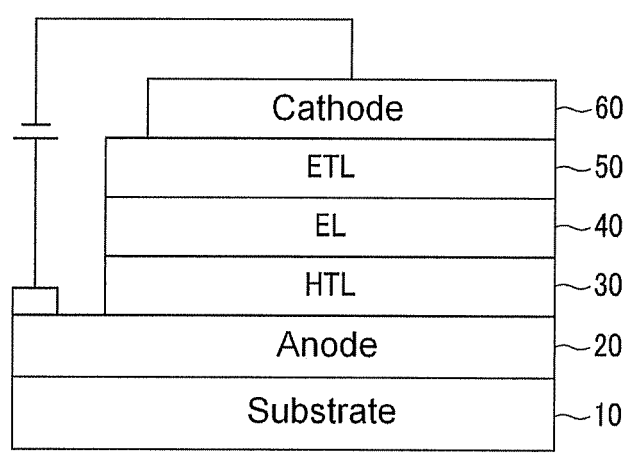
FIG. 3 is a cross-sectional view illustrating an exemplary embodiment of a display device including a nanocrystal.

FIG. 3 is a schematic diagram illustrating an exemplary embodiment of the organic light emitting display device. In the display device, an anode 20 is disposed on an organic substrate 10. The anode 20 may comprise a high work function material to allow holes to be injected therein. In an embodiment, the anode material may comprise a transparent oxide such as indium tin oxide ("ITO"), indium oxide, or the like, or a combination comprising at least one of the foregoing transparent oxides.

A hole transport layer ("HTL") 30, an emission layer ("EL") 40 and an electron transport layer ("ETL") 50 are sequentially disposed on the anode 20. The hole transport layer 30 may contain a p-type semiconductor, and the electron transport layer 50 may contain an n-type semiconductor, a metal oxide, or the like or a combination comprising at least one of the foregoing. The emission layer 40 comprises a nanocrystal as described above.

A cathode 60 is disposed on the electron transport layer 50. The cathode 60 may comprise a low work function material to facilitate the injection of electrons therein. Exemplary cathode materials include metals, such as magnesium, calcium, sodium, potassium, titanium, indium, yttrium, lithium, gadolinium, aluminum, silver, tin, lead, cesium, barium, or the like, combinations thereof or alloys thereof; and multilayer materials, such as LiF/Al, $LiO_2$/Al, LiF/Ca, LiF/Al, $BaF_2$/Ca, or the like or a combination thereof. Methods for the formation of the constituent electrodes and layers and methods for the fabrication of the display device are known in the art, and thus their further description is omitted herein.

In accordance with another exemplary embodiment, there is provided a color converting light emitting device including the semiconductor nanocrystals.

Figure 20:
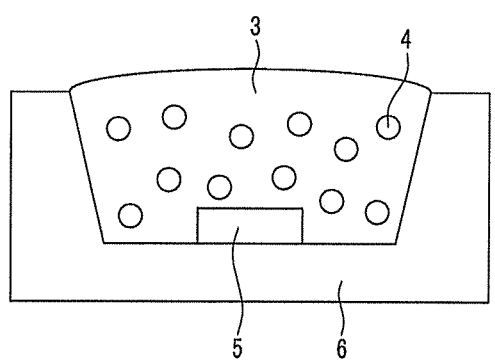
FIG. 20 is a cross-sectional view of an exemplary embodiment of a color converting light emitting device.

FIG. 20 is a cross-sectional view of an exemplary embodiment of the color converting light emitting device.

In an embodiment, the color converting light emitting device may be fabricated by the following procedure. First, a silver substrate 6 having a recessed portion is disposed. A light emitting diode chip 5 emitting light corresponding to a blue or UV region is disposed on the substrate 6.

A matrix 3 containing a semiconductor nanocrystal 4 is disposed on the light emitting diode chip 5. The semiconductor nanocrystals prepared according to an exemplary embodiment of the foregoing methods may be used as the semiconductor nanocrystal 4. Red, green and blue emitting nanocrystals may also be used as the semiconductor nanocrystal 4. The matrix 3 may comprise an organic or inorganic material. A mixture of the semiconductor nanocrystal 4 and the matrix 3 is applied to the recessed portion of the substrate 6 to cover the light emitting diode chip 5.

The semiconductor nanocrystal 4 can absorb emission energy from the light emitting diode chip 5 and emit light having a wavelength corresponding to the excitation energy. The semiconductor nanocrystal 4 can emit light with various emission wavelengths and having high color purity. In an embodiment, a white light emitting diode can be produced by combining red and green nanocrystals with a blue light emitting diode chip or by combining red, green and blue nanocrystals with a UV light emitting diode chip. A combination of nanocrystals capable of emitting light of various wavelengths and a light emitting diode chip can provide a light emitting diode of various wavelengths.

A further description of exemplary embodiments is described herein with reference to the following examples. However, these examples are given merely for the purpose of illustration and are not to be construed as limiting the scope of the embodiments.

EXAMPLES

Example 1

Preparation of an InZnP Core and an InZnP/ZnS Nanocrystal

Example 1-1

Indium acetate (0.2 millimoles ("mmol") and zinc acetate (0.05 mmol) are added to a mixture of palmitic acid (0.7 mmol) and octadecene (10 milliliters "mL"), heated to 120° C. under vacuum, and maintained at 120° C. for one hour. The resulting mixture is heated to 280° C. under a nitrogen atmosphere, and then a solution of 0.1 mmol of trimethylsilyl-3-phosphine and 1 mL of trioctyl phosphine is injected into therein. After the injection, the solution is allowed to react for 2 minutes. The reaction solution is rapidly cooled to room temperature, which is less than 25° C., followed by acetone treatment to separate an InZnP core having an optical density of 0.1.

Example 1-2

Zinc acetate (0.3 mmol) is added to a mixture of oleic acid (0.9 mmol) and octadecene (10 mL), heated to 120° C. under a vacuum and maintained at 120° C. for one hour. The resulting mixture is heated to 240° C. under a nitrogen atmosphere, and then 1.5 mL of a 0.4 M sulfur/trioctyl phosphine solution and 1 mL of the InZnP core prepared in Example 1-1 is injected therein. The mixture is heated to 280° C. and reacted for one hour. The reaction solution is cooled to room temperature, which is less than 25° C., to separate an InZnP/ZnS nanocrystal.

Example 2

Preparation of an InZnP Core and an InZnP/ZnS Nanocrystal

Example 2-1

An InZnP core is separated in the same manner as in Example 1-1 except that 0.4 mmol of indium acetate, 0.1 mmol of zinc acetate, 1.2 mmol of palmitic acid, 20 mL of octadecene and 0.2 mmol of trimethylsilyl-3-phosphine are used.

Example 2-2

Zinc acetate (0.3 mmol) is added to a mixture of oleic acid (0.6 mmol) and octadecene (10 mL), heated to 300° C. under a vacuum and maintained at 300° C. for one hour. The resulting mixture is cooled to 150° C. under a nitrogen atmosphere, and then 1.5 mL of a 0.4 M sulfur/trioctyl phosphine solution and 1 mL of the InZnP core prepared in Example 2-1 is injected therein. The mixture is heated to 300° C. and reacted for one hour. The reaction solution is cooled to room temperature, which is less than 25° C., to separate an InZnP/ZnS nanocrystal.

Example 3

Preparation of an InZnP Core and an InZnP/ZnS Nanocrystal

Example 3-1

An InZnP core having an optical density of 0.2 is separated in the same manner as in Example 1-1, except that trimethylsilyl-3-phosphine and trioctyl phosphine are injected into a mixture of In and Zn at room temperature, which is less than 25° C., to prepare an InZnP intermediate, and the InZnP intermediate is allowed to react at 320° C.

Example 3-2

An InZnP/ZnS nanocrystal is separated in the same manner as in Example 1-2 except that 0.15 mmol of zinc acetate, 0.3 mmol of oleic acid, 5 mL of octadecene, the InZnP core prepared in Example 3-1 and 0.75 mL of a sulfur/trioctyl phosphine solution are used.

Example 4

Preparation of an InZnP Core and an InZnP/ZnS Nanocrystal

Example 4-1

An InZnP core is separated in the same manner as in Example 3-1, except that 0.2 mmol of trimethylsilyl-3-phosphine is used.

Example 4-2

An InZnP/ZnS nanocrystal is separated in the same manner as in Example 3-2, except that the InZnP core prepared in Example 4-1 is used.

Example 5

Preparation of an InZnP Core and an InZnP/ZnS Nanocrystal

Example 5-1

An InZnP core is separated in the same manner as in Example 3-1, except that 0.1 mmol of zinc acetate, 0.8 mmol of palmitic acid and 0.2 mmol of trimethylsilyl-3-phosphine are used.

Example 5-2

An InZnP/ZnS nanocrystal is separated in the same manner as in Example 3-2, except that the InZnP core prepared in Example 5-1 is used.

Example 6

Preparation of an InZnP Core and an InZnP/ZnS Nanocrystal

Example 6-1

A InZnP core is separated in the same manner as in Example 1-1, except that 2 mL of octadecene is used to prepare a mixture of In and Zn, trimethylsilyl-3-phosphine and trioctyl phosphine are injected into the In/Zn mixture at room temperature, which is less than 25° C., to prepare an InZnP intermediate, and the InZnP intermediate is injected into 10 mL of octadecene at 300° C. under a nitrogen atmosphere and reacted for 2 minutes.

Example 6-2

An InZnP/ZnS nanocrystal is separated in the same manner as in Example 2-2, except that the InZnP core prepared in Example 6-1 is used.

Comparative Example 1

Preparation of an InP Core and an InP/ZnS Nanocrystal

Comparative Example 1-1

An InP core having an optical density of 0.21 are separated in the same manner as in Example 1-1, except that zinc acetate is not used and 0.6 mmol of palmitic acid is used.

Comparative Example 1-2

An InP/ZnS nanocrystal is separated in the same manner as in Example 1-1, except that 0.15 mmol of zinc acetate, 0.3 mmol of oleic acid, 5 mL of octadecene, 1.4 mL of the InP core prepared in Comparative Example 1-1 and 0.75 mL of a sulfur/trioctyl phosphine solution are used.

Measurements of Absorption and Emission Spectra

The absorption and emission spectra of the colloidal nanocrystals prepared in Examples 1 to 6 and Comparative Example 1 are measured.

Figure 4:
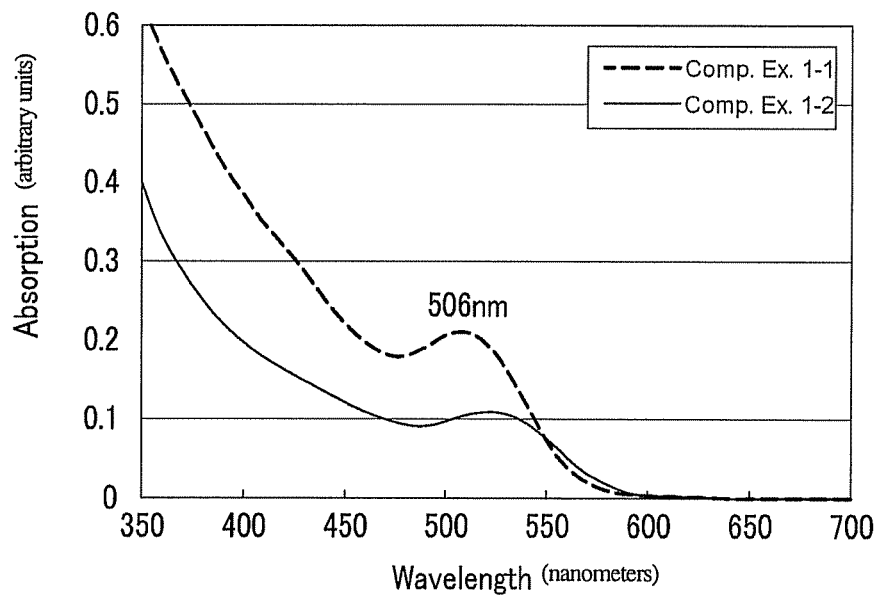
FIGS. 4 and 5 show absorption spectra of an InP core and an InP/ZnS nanocrystal prepared in Comparative Example 1, and an emission spectrum of the InP/ZnS nanocrystal, respectively.
Figure 5:
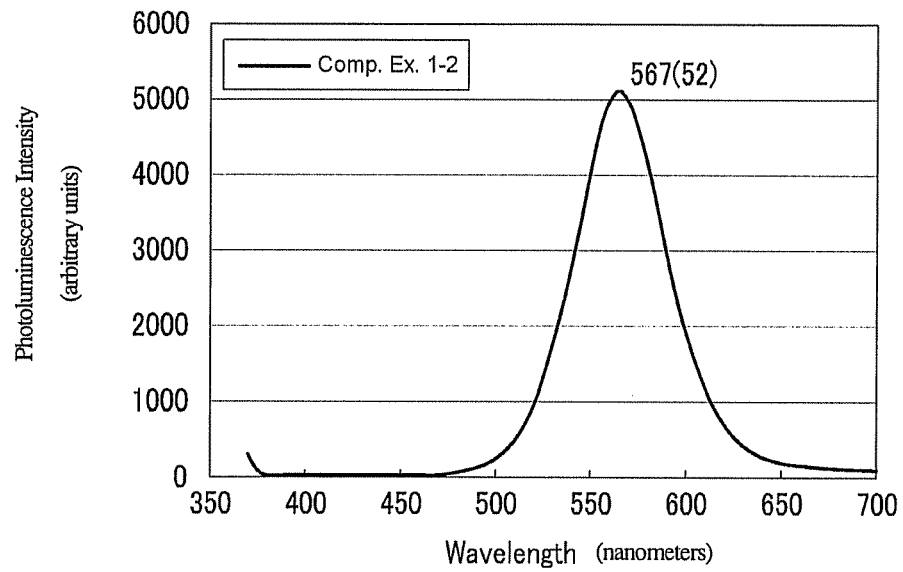
Figure 6:
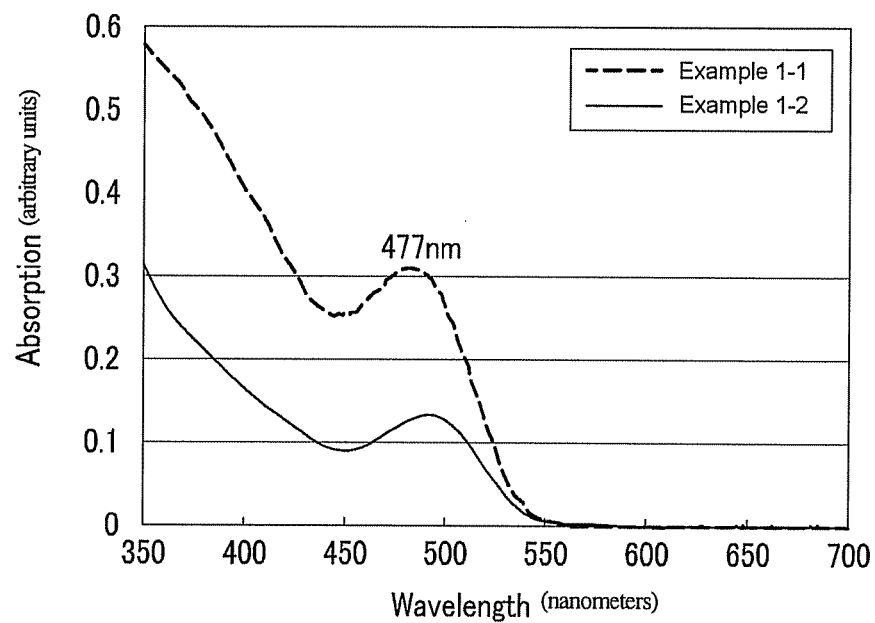
FIGS. 6 and 7 show absorption spectra of an InZnP core and an InZnP/ZnS nanocrystal prepared in Example 1, and an emission spectrum of the InZnP/ZnS nanocrystal, respectively.
Figure 7:
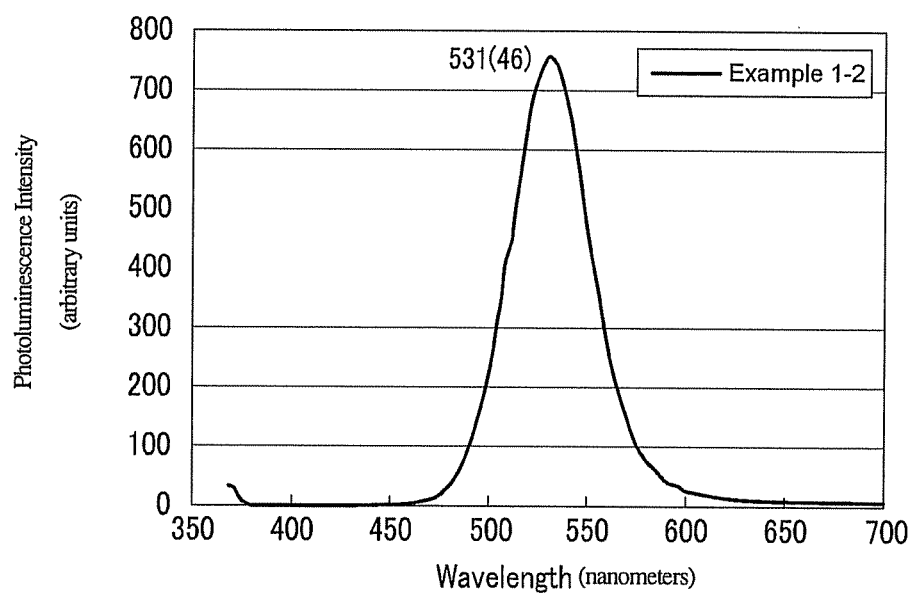

FIGS. 4 and 5 show absorption spectra of the InP core and the InP/ZnS nanocrystal prepared in Comparative Example 1, and an emission spectrum of the InP/ZnS nanocrystal, respectively. FIGS. 6 and 7 show absorption spectra of the InZnP core and the InZnP/ZnS nanocrystal prepared in Example 1, and an emission spectrum of the InZnP/ZnS nanocrystal, respectively. As can be seen from the spectra of FIGS. 4 through 7, zinc is alloyed with the core of Example 1 thereby shortening the emission wavelength of the semiconductor nanocrystal of Example 1 from 567 nm to 531 nm. This observation indicates that zinc alloying controls the emission wavelength of the semiconductor nanocrystal and decreases the FWHM of the emission peak from 52 nm to 46 nm, resulting in increased color purity.

Figure 8:
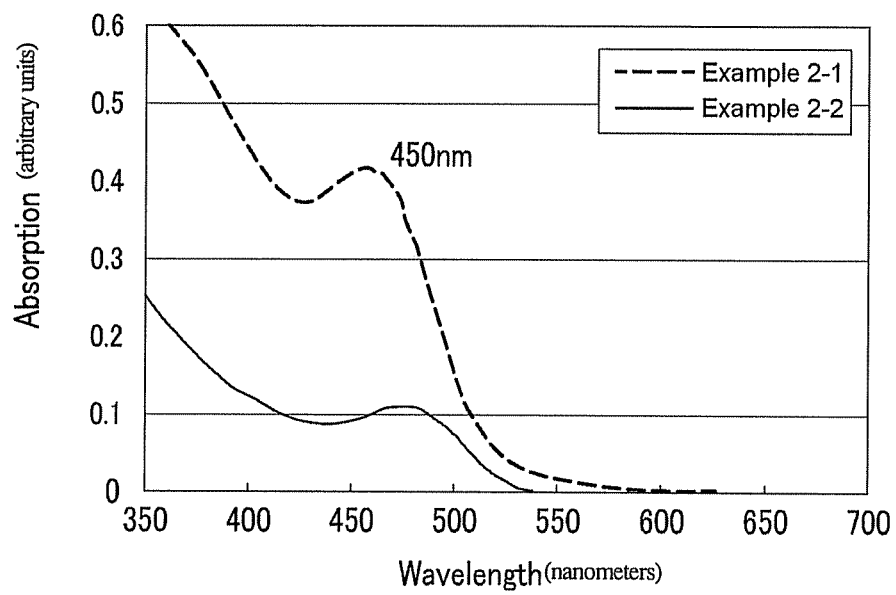
FIGS. 8 and 9 show absorption spectra of an InZnP core and an InZnP/ZnS nanocrystal prepared in Example 2, and an emission spectrum of the InZnP/ZnS nanocrystal, respectively.
Figure 9:
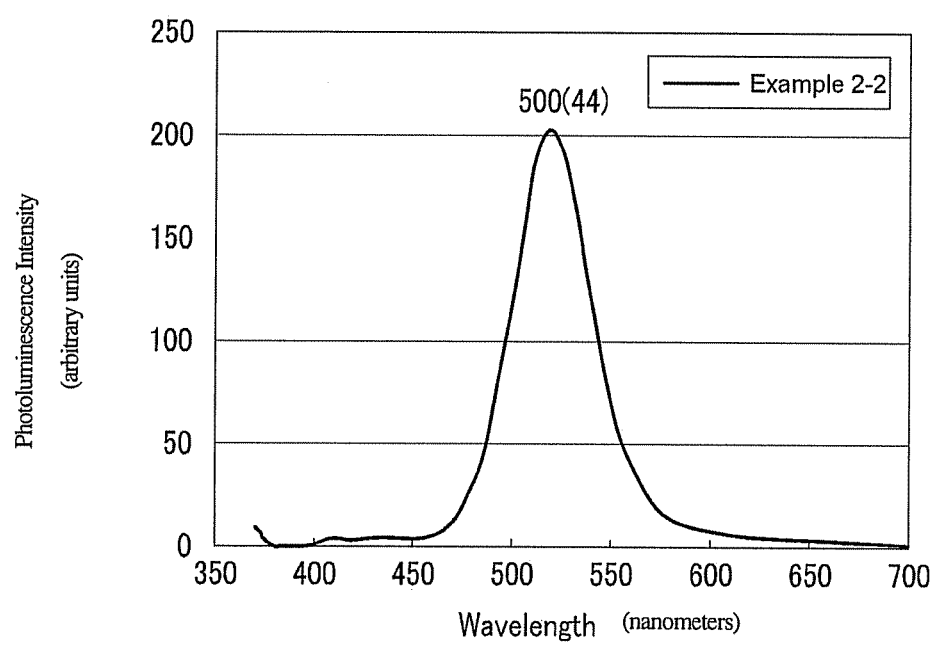

FIGS. 8 and 9 show absorption spectra of the InZnP core and the InZnP/ZnS nanocrystal prepared in Example 2, and an emission spectrum of the InZnP/ZnS nanocrystal, respectively. The spectra of FIGS. 6 through 9 demonstrate that a decrease in the molar ratio indium:palmitic acid from 1:3.5 to 1:3 shortens the emission wavelength of the InZnP/ZnS nanocrystal prepared in Example 2 from 531 nm to 500 nm without any significant change in the FWHM of the emission peaks.

Figure 10:
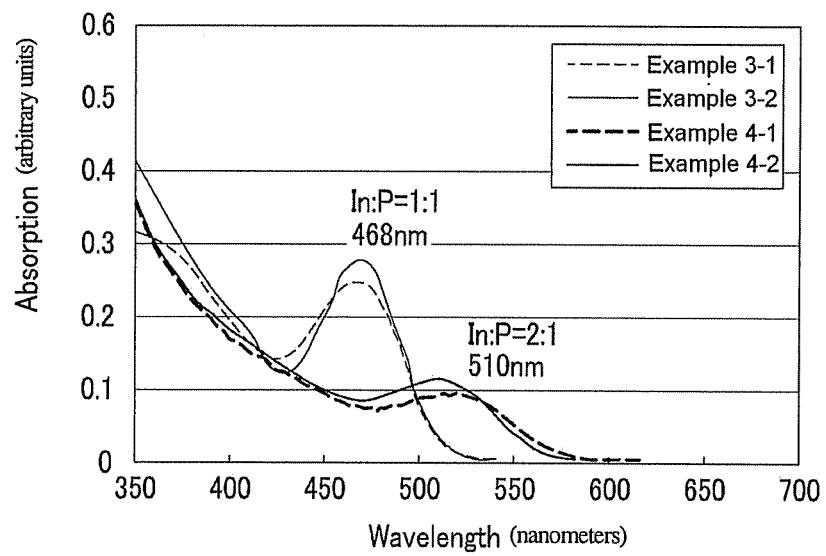
FIGS. 10 and 11 show absorption spectra of an InZnP nanocrystal and an InZnP/ZnS nanocrystal prepared in Examples 3 and 4, and emission spectra of the InZnP/ZnS nanocrystal, respectively.
Figure 11:
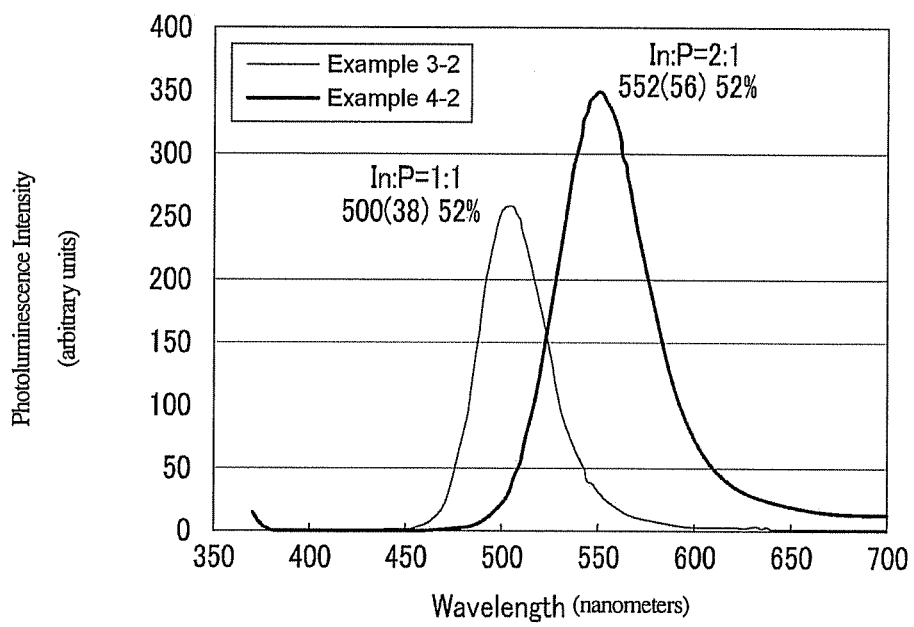

FIGS. 10 and 11 show absorption spectra of the InZnP cores and the InZnP/ZnS nanocrystals prepared in Examples 3 and 4 and emission spectra of the InZnP/ZnS nanocrystals, respectively. The spectra of FIGS. 4, 5, 10 and 11 show that the emission wavelength of the InZnP/ZnS nanocrystal prepared in Example 3 is blue-shifted from 567 nm to 552 nm, and that an increase in the relative amount (molar amount) of phosphorus (P) with respect to indium (In) in the InZnP/ZnS nanocrystals of Examples 3 and 4 results in a blue shift of the emission wavelength from 552 nm to 500 nm and a decrease in the FWHM of the emission peaks from 56 nm to 38 nm.

Figure 12:
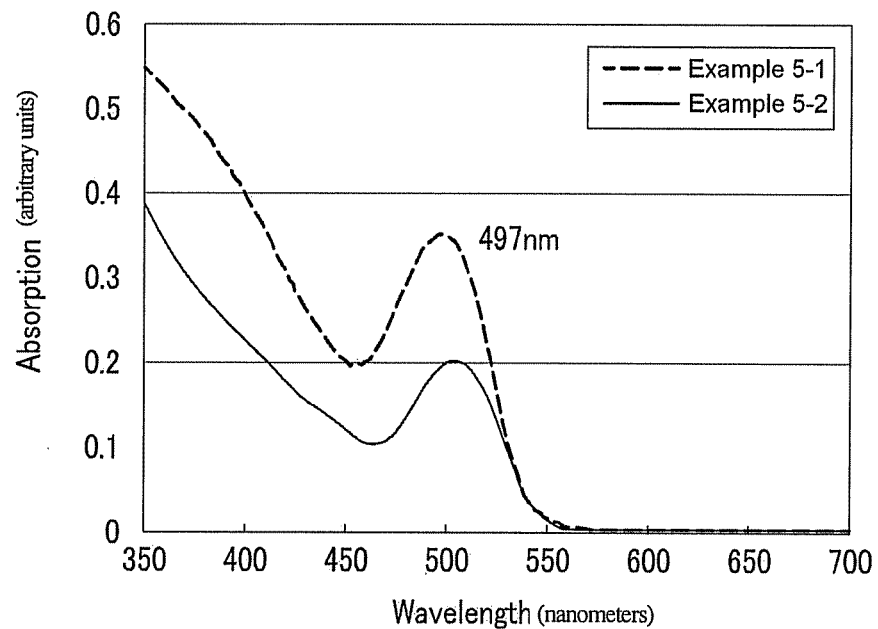
FIGS. 12 and 13 show absorption spectra of an InZnP core and an InZnP/ZnS nanocrystal prepared in Example 5, and an emission spectrum of the InZnP/ZnS nanocrystal, respectively.
Figure 13:
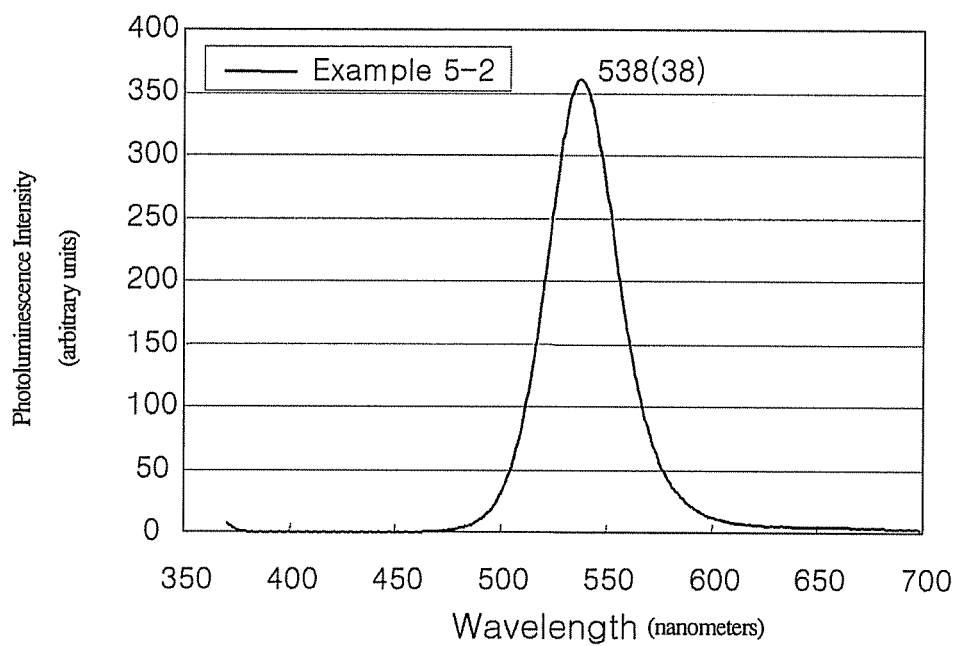

FIGS. 12 and 13 show absorption spectra of the InZnP core and the InZnP/ZnS nanocrystal prepared in Example 5, and an emission spectrum of the InZnP/ZnS nanocrystal, respectively. The spectra of FIGS. 4, 5, 12 and 13 show that an increase in the relative amount (molar amount) of phosphorus (P) with respect to indium (In) results in a decrease in the FWHM of the emission peaks from 52 nm to 38 nm.

Figure 14:
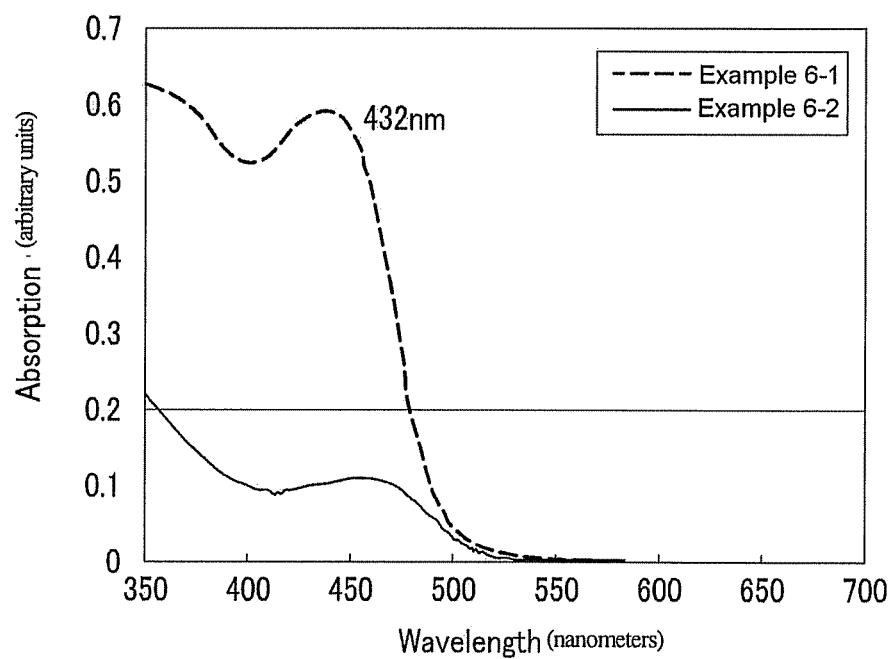
FIGS. 14 and 15 show absorption spectra of an InZnP core and an InZnP/ZnS nanocrystal prepared in Example 6, and an emission spectrum of the InZnP/ZnS nanocrystal, respectively.
Figure 15:
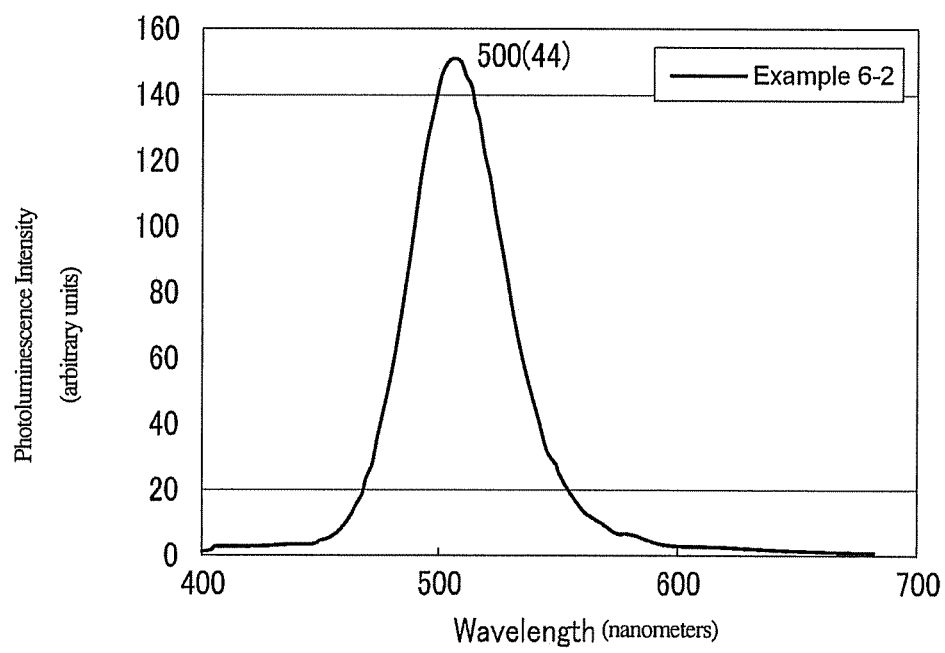

FIGS. 14 and 15 show absorption spectra of the InZnP core and the InZnP/ZnS nanocrystal prepared in Example 6, and an emission spectrum of the InZnP/ZnS nanocrystal, respectively. The emission wavelength of the nanocrystal prepared using the InZnP intermediate in Example 6-2 is blue-shifted to 500 nm and the FWHM of the emission peak is decreased to 44 nm.

Observation of Nanocrystal Particles

Figure 16:
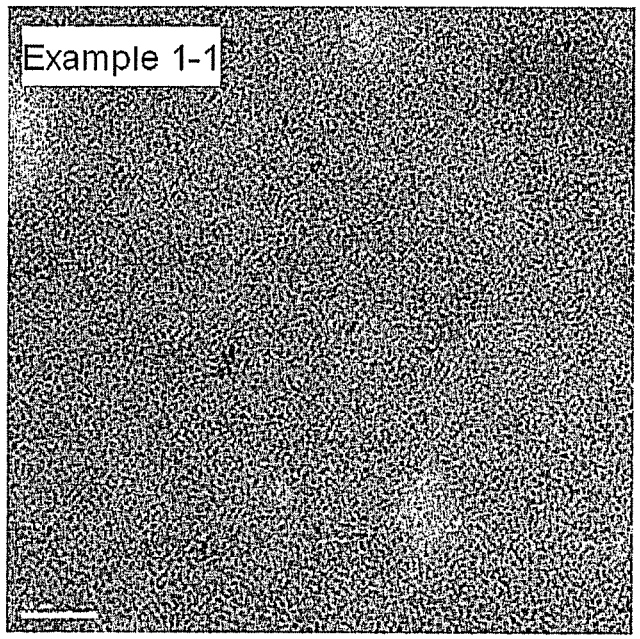
FIGS. 16 and 17 show transmission electron microscopy ("TEM") images of an InZnP core and an InZnP/ZnS nanocrystal prepared in Example 1, respectively.
Figure 17:
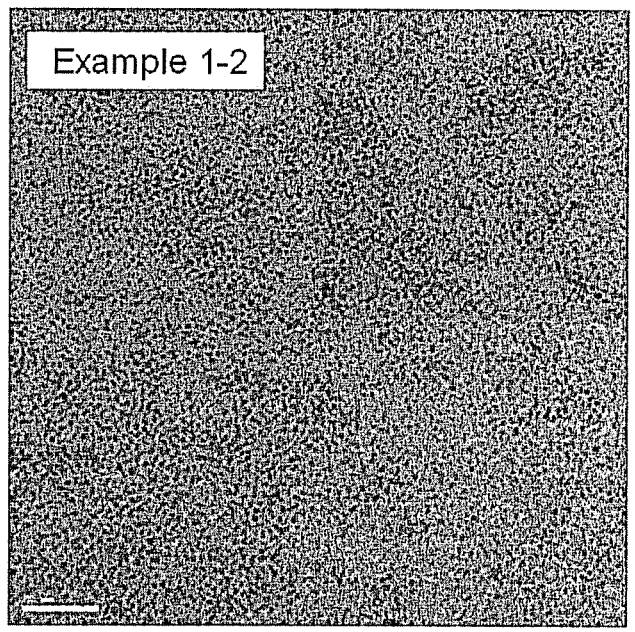

Transmission electron microscopy ("TEM") images of the nanocrystal particles prepared in Example 1 are shown in FIGS. 16 and 17. The images show that the nanocrystal particles are uniform. The InZnP/ZnS particles are observed to have a size of about 3.5 nm.

Figure 18:
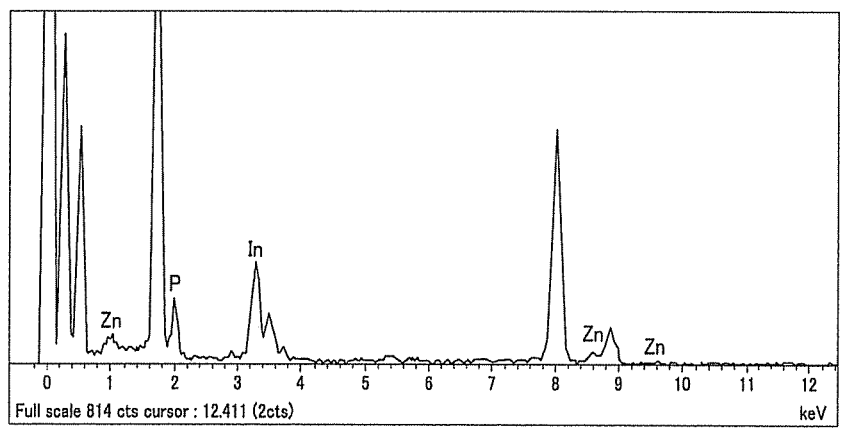
FIGS. 18 and 19 are graphs showing the results of energy dispersive spectroscopy ("EDS") for an InZnP core and an InZnP/ZnS nanocrystal prepared in Example 1.
Figure 19:
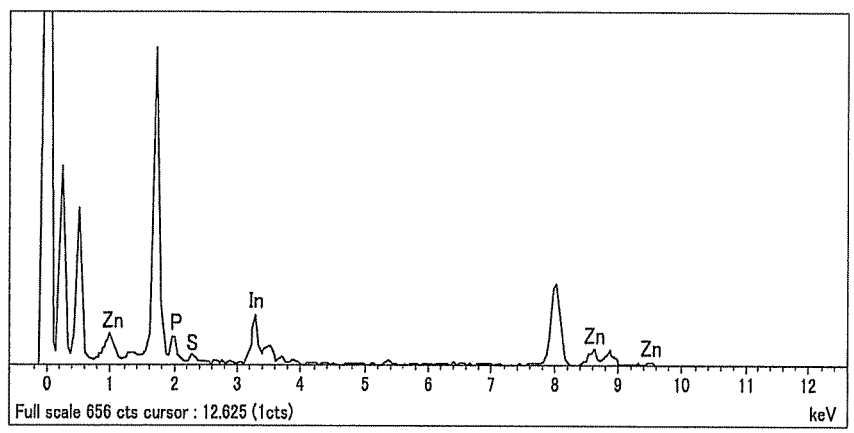

The nanocrystal particles prepared in Example 1 are analyzed by energy dispersive spectroscopy ("EDS"). FIGS. 18 and 19 are graphs showing the results of elemental analysis for the nanocrystal particles. The graphs reveal that zinc is alloyed with the cores of the nanocrystal particles.

As is apparent from the foregoing, the transition metal precursor can be added as a reactant to control the reaction rate of the Group III and Group V elements in the preparation of the Group III-V semiconductor nanocrystals. As a result of the reaction, the emission wavelength of the semiconductor nanocrystals can be selected be to a desired wavelength and the color purity of the semiconductor nanocrystals can be improved.

Although exemplary embodiments have been described herein with reference to the foregoing embodiments, those skilled in the art will appreciate that various modifications and changes are possible without departing from the spirit of the invention as disclosed in the accompanying claims. Therefore, it is to be understood that such modifications and changes are encompassed within the scope of the invention.

What is claimed is:
1. A nanocrystal comprising,
a core comprising a Group III-V semiconductor and a transition metal alloyed with the Group III-V semiconductor,
wherein equal to or greater than about 80 mole percent of the transition metal in the core is within about 1 nanometer of an outermost surface of the core, wherein an increasing concentration gradient of the transition metal extends from a central portion of the core to an outermost surface layer of the core, wherein the transition metal is present in the central portion and in the outermost surface layer of the core, and wherein the nanocrystal is effective to emit a direct transition emission.

2. The nanocrystal of claim 1, wherein the Group III-V semiconductor comprises a Group III element, and the Group III element and the transition metal in the core are present in a molar ratio between about 10:1 and about 100:1.

3. The nanocrystal of claim 1, wherein the Group III-V semiconductor comprises a Group III element and a Group V element, and the Group III element and the Group V element in the core are present in a molar ratio between about 1:1 and about 3:1.

4. The nanocrystal of claim 1, further comprising a shell formed on an outermost surface of the core, wherein the shell comprises a semiconductor selected from the group consisting of a Group II-VI semiconductor, a Group III-V semiconductor, a Group IV-VI semiconductor and a combination thereof.

5. The nanocrystal of claim 1, wherein the transition metal is a transition metal having two or more oxidation states.

6. The nanocrystal of claim 1, wherein the transition metal is selected from the group consisting of Zn, Mn, Cu, Fe, Ni, Co, Cr, V, Ti, Zr, Nb, Mo, Ru, Rh and a combination thereof.

7. The nanocrystal of claim 1, wherein the emission wavelength of the nanocrystal is between about 450 nanometers and about 750 nanometers.

8. A light emitting device comprising the nanocrystal of claim 1 as a luminescent material.

9. The nanocrystal of claim 1, wherein between about 5 mole percent and about 95 mole percent of the transition metal is present in an outermost surface layer of the core, the outermost surface layer having a thickness between about 0.1 nanometers and about 3 nanometers.

10. A method for preparing a nanocrystal, the method comprising:

mixing an organic solvent, a surfactant, a Group III element precursor and a transition metal precursor to form a mixture;

heating the mixture;

adding a Group V element precursor to the mixture while maintaining a substantially constant reaction temperature to provide the nanocrystal, the nanocrystal comprising:

a core comprising a Group III-V semiconductor and a transition metal alloyed with the Group III-V semiconductor, wherein equal to or greater than about 80 mole percent of the transition metal in the core is within about 1 nanometer of an outermost surface of the core, wherein an increasing concentration gradient of the transition metal extends from a central portion of the core to an outermost surface layer of the core, wherein the transition metal is present in the central portion and in the outermost surface layer of the core, and wherein the nanocrystal is effective to emit a direct transition emission.

11. The method of claim 10, wherein the molar ratio of the Group III element precursor to the surfactant is between about 1:1 and about 1:20.

12. The method of claim 10, wherein the molar ratio of the Group III element to the transition metal is between about 10:1 and about 100:1.

13. The method of claim 10, wherein the molar ratio of the Group III element to the Group V element is between about 1:1 and about 3:1.

14. The method of claim 10, wherein the transition metal is selected from the group consisting of Zn, Mn, Cu, Fe, Ni, Co, Cr, V, Ti, Zr, Nb, Mo, Ru, Rh and a combination thereof.

15. The method of claim 10, wherein the reaction temperature is between about 250° C. and about 350° C.

16. The method of claim 10, further comprising forming a shell comprising a semiconductor selected from the group consisting of a Group II-V semiconductor, a Group III-V semiconductor, a Group IV-VI semiconductor and a combination thereof on the core.

17. A nanocrystal comprising:

a core comprising In, Zn and P, wherein equal to or greater than about 80 mole percent of the Zn is containing in an outermost surface layer of the core, the outermost surface layer having a thickness of equal to or less than about 1 nanometer, wherein an increasing concentration gradient of the zinc extends from a central portion of the core to an outermost surface layer of the core, and wherein the zinc is present in the central portion and in the outermost surface layer of the core; and a shell, the shell comprising ZnS, wherein the nanocrystal is effective to emit a direct transition emission.

18. A method for preparing a nanocrystal, the method comprising:

mixing an organic solvent, a surfactant a Group III element precursor and a transition metal precursor to prepare a first mixture;

injecting a Group V element precursor into the first mixture at about room temperature to prepare a second mixture; and heating the second mixture and maintaining the reaction temperature constant to prepare the nanocrystal, the nanocrystal comprising a core comprising a Group III-V semiconductor and a transition metal alloyed with the Group III-V semiconductor, wherein equal to or greater than about 80 mole percent of the transition metal in the core is within about 1 nanometer of an outermost surface of the core, wherein an increasing concentration gradient of the transition metal extends from a central portion of the core to an outermost surface layer of the core, wherein the transition metal is present in the central portion and in the outermost surface layer of the core, and wherein the nanocrystal is effective to emit a direct transition emission.

19. The method of claim 18, wherein the molar ratio of the Group III element to the transition metal is between about 10:1 and about 100:1.

20. The method of claim 18, wherein the molar ratio of the Group III element to the Group V element is between about 1:1 and about 3:1.

21. The method of claim 18, wherein the transition metal is selected from the group consisting of Zn, Mn, Cu, Fe, Ni, Co, Cr, V, Ti, Zr, Nb, Mo, Ru, Rh and combinations thereof.

22. The method of claim 18, wherein the reaction is carried out at a temperature of about 250° C. to about 350° C.

23. The method of claim 18, further comprising forming a shell composed of a semiconductor selected from the group consisting of a Group II-V semiconductor, a Group III-V semiconductor, a Group IV-VI semiconductor and a combination thereof on the nano crystal.

24. A method for preparing a nanocrystal, the method comprising:

mixing a first organic solvent, a surfactant, a Group II element precursor and a transition metal precursor to prepare a first mixture;

injecting a Group V element precursor into the first mixture at about room temperature to prepare a second mixture; and heating a second organic solvent and injecting the second mixture into the second organic solvent while maintaining the reaction temperature constant to prepare the nanocrystal, the nanocrystal comprising a core comprising a Group III-V semiconductor and a transition metal alloyed with the Group III-V semiconductor, wherein equal to or greater than about 80 mole percent of the transition metal in the core is within about 1 nanometer of an outermost surface of the core, wherein an increasing concentration gradient of the transition metal extends from a central portion of the core to an outermost surface layer of the core, wherein the transition metal is present in the central portion and in the outermost surface layer of the core, and wherein the nanocrystal is effective to emit a direct transition emission.

25. The method of claim 24, wherein the molar ratio of the Group III element to the transition metal is between about 10:1 and about 100:1.

26. The method of claim 24, wherein the molar ratio of the Group III element to the Group V element is between about 1:1 and about 3:1.

27. The method of claim 24, wherein the transition metal is selected from the group consisting of Zn, Mn, Cu, Fe, Ni, Co, Cr, V, Ti, Zr, Nb, Mo, Ru, Rh and a combination thereof.

28. The method of claim 24, wherein the reaction is carried out at a temperature of about 150° C. to about 350° C.

29. The method of claim 24, further comprising forming a shell composed of a semiconductor selected from the group consisting of a Group II-V semiconductor, a Group III-V semiconductor, a Group IV-VI semiconductor and a combination thereof on the nano crystal.

* * * * *